(12) United States Patent
Wilcox et al.

(10) Patent No.: US 11,894,499 B2
(45) Date of Patent: Feb. 6, 2024

(54) LENS ARRANGEMENTS FOR LIGHT-EMITTING DIODE PACKAGES

(71) Applicant: CreeLED, Inc., Durham, NC (US)

(72) Inventors: Robert Wilcox, Rolesville, NC (US); Derek Miller, Raleigh, NC (US); Kyle Damborsky, Apex, NC (US); Aaron Francis, Apex, NC (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 70 days.

(21) Appl. No.: 16/918,137

(22) Filed: Jul. 1, 2020

(65) Prior Publication Data
US 2022/0005987 A1 Jan. 6, 2022

(51) Int. Cl.
| | | |
|---|---|---|
| *H01L 33/58* | (2010.01) | |
| *H01L 33/64* | (2010.01) | |
| *H01L 33/62* | (2010.01) | |
| *H01L 33/56* | (2010.01) | |

(52) U.S. Cl.
CPC ............. *H01L 33/58* (2013.01); *H01L 33/62* (2013.01); *H01L 33/642* (2013.01); *H01L 33/56* (2013.01)

(58) Field of Classification Search
CPC ....... H01L 33/58; H01L 33/62; H01L 33/642; H01L 33/56; H01L 25/0753
See application file for complete search history.

(56) References Cited

U.S. PATENT DOCUMENTS

| | | | | |
|---|---|---|---|---|
| 9,954,143 | B2 * | 4/2018 | Tanuma | H01L 31/167 |
| 2011/0215698 | A1 * | 9/2011 | Tong | F21V 29/63 |
| | | | | 165/104.34 |
| 2012/0229701 | A1 * | 9/2012 | Pavithran | H04N 23/51 |
| | | | | 348/374 |
| 2013/0258187 | A1 * | 10/2013 | Park | H04N 23/55 |
| | | | | 348/374 |
| 2014/0084322 | A1 * | 3/2014 | Park | H01L 33/483 |
| | | | | 257/98 |
| 2014/0284650 | A1 * | 9/2014 | Jung | H01L 33/58 |
| | | | | 438/26 |
| 2015/0172519 | A1 * | 6/2015 | Mitarai | H04N 23/55 |
| | | | | 348/373 |
| 2015/0173629 | A1 * | 6/2015 | Corl | A61B 5/02158 |
| | | | | 600/486 |
| 2017/0280558 | A1 * | 9/2017 | Ohara | G03B 17/55 |

* cited by examiner

*Primary Examiner* — Ratisha Mehta
(74) *Attorney, Agent, or Firm* — Withrow & Terranova, P.L.L.C.

(57) ABSTRACT

Solid-state lighting devices including light-emitting diodes (LEDs) and lens arrangements for packaged LED devices are disclosed. An LED package may include one or more LED chips on a submount with a lens positioned on the submount to form a cavity. The one or more LED chips may reside in the cavity without direct encapsulation materials that would otherwise contact the one or more LED chips and any corresponding wirebonds. In this manner, the one or more LED chips may be driven with higher drive currents while reducing degradation and mechanical strain effects related to differences in coefficients of thermal expansion with typical encapsulant materials. LED packages may also be configured with one or more apertures that allow air flow between an interior volume of a cavity and an ambient environment outside the LED package to promote heat dissipation at higher drive currents.

24 Claims, 7 Drawing Sheets

LENS ARRANGEMENTS FOR LIGHT-EMITTING DIODE PACKAGES

FIELD OF THE DISCLOSURE

The present disclosure relates to solid-state lighting devices including light-emitting diodes (LEDs), and more particularly to packaged LED devices.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment are either refracted or internally reflected. If photons are internally reflected in a repeated manner, then such photons eventually are absorbed and never provide visible light that exits an LED.

LED packages have been developed that include a single LED chip or multiple LED chips arranged within the same package. In some multiple LED chip packages, the LED chips can be provided such that emissions corresponding to individual LED chips are combined to produce a desired light emission for the LED package. The emissions corresponding to individual LED chips can be configured to provide similar or different colors that are combined to provide an overall light output for the LED package. In other multiple LED chip packages, emissions corresponding to different LED chips can be configured to provide different emission characteristics for such packages. There can be challenges in producing high quality light with desired emission characteristics in single LED chip and multiple LED chip packages, particularly for higher light output applications with smaller package sizes.

The art continues to seek improved LEDs and solid-state lighting devices having desirable illumination characteristics capable of overcoming challenges associated with conventional lighting devices.

SUMMARY

The present disclosure relates to solid-state lighting devices including light-emitting diodes (LEDs), and more particularly to lens arrangements for packaged LED devices. An LED package may include one or more LED chips on a submount with a lens positioned on the submount and over the one or more LED chips to form a cavity. The one or more LED chips may reside in the cavity without direct encapsulation materials that would otherwise surround and contact the one or more LED chips and any corresponding wirebonds. By positioning the one or more LED chips within such a cavity, the one or more LED chips may be driven with higher drive currents while reducing degradation and mechanical strain effects related to differences in coefficients of thermal expansion with typical encapsulant materials. In various aspects, LED packages may also be configured with one or more apertures that allow air flow between an interior volume of a cavity and an ambient environment outside the LED package to promote further heat dissipation at higher drive currents.

In one aspect, an LED package comprises: a submount; at least one LED chip on the submount; and a lens on the submount such that a cavity is at least partially formed between the lens and the submount, the cavity being registered with the at least one LED chip and configured to allow air flow between an interior volume of the cavity and an ambient environment outside the LED package. The LED package may further comprise at least one spacer that is arranged between the lens and the submount such that the lens, the at least one spacer and the submount form the cavity. In certain embodiments, the at least one spacer forms a height from the submount that is greater than a height of the at least one LED chip. In certain embodiments, the at least one spacer forms at least one aperture that is arranged to allow the air flow from outside the LED package. In certain embodiments, the at least one spacer forms a plurality of apertures arranged to allow the air flow from outside the LED package. In certain embodiments, the at least one spacer forms a first aperture at a first peripheral edge of the lens and a second aperture at a second peripheral edge of the lens. In certain embodiments, the at least one spacer is arranged along a perimeter of the lens. In certain embodiments, the lens is at least partially embedded within the at least one spacer along the perimeter of the lens. The at least one spacer may comprise silicone. In certain embodiments, the lens is attached to the at least one spacer with an adhesive material. In certain embodiments, the lens forms a rectangular shape and the at least one spacer is arranged at one or more corners of the lens. The lens may form a rectangular shape and the at least one spacer may be arranged along one or more side edges of the lens. In certain embodiments, the submount comprises a plurality of electrical traces that are electrically coupled to the at least one LED chip. The at least one LED chip may be electrically coupled to a first electrical trace of the plurality of electrical traces by at least one wire bond, the at least one wire bond being arranged within the cavity. The LED package may further comprise at least one spacer that is arranged between the lens and the submount such that the lens, the at least one spacer and the submount form the cavity, and the at least one spacer is arranged to at least partially cover the plurality of electrical traces.

In another aspect, a LED package comprises: a submount comprising a first face and a second face that opposes the first face; at least one LED chip on the first face; and a lens attached to portions of the first face that laterally surround the at least one LED chip such that a cavity is at least partially formed between the lens and the submount, the cavity configured to allow air flow between an interior volume of the cavity and an ambient environment outside the LED package. In certain embodiments, the lens forms at least one aperture that is arranged to allow the air flow from outside the LED package. The lens may form a plurality of apertures arranged to allow the air flow from outside the LED package. In certain embodiments, the lens comprises lens portions that extend below a horizontal plane defined by a top surface of the at least one LED chip. The lens portions may be adhered to the submount by an adhesive. In certain embodiments, the lens forms a rectangular shape and the lens portions are arranged at one or more corners of the lens. In certain embodiments, the lens forms a rectangular shape and the lens portions are arranged along one or more side edges of the lens. In certain embodiments, the submount comprises a plurality of electrical traces that are electrically coupled to the at least one LED chip. The at least one LED chip may be electrically coupled to a first electrical trace of the plurality of electrical traces by at least one wire bond, the at least one wire bond being arranged within the cavity.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to solid-state lighting devices including light-emitting diodes (LEDs), and more particularly to lens arrangements for packaged LED devices. An LED package may include one or more LED chips on a submount with a lens positioned on the submount and over the one or more LED chips to form a cavity. The one or more LED chips may reside in the cavity without direct encapsulation materials that would otherwise surround and contact the one or more LED chips and any corresponding wirebonds. By positioning the one or more LED chips within such a cavity, the one or more LED chips may be driven with higher drive currents while reducing degradation and mechanical strain effects related to differences in coefficients of thermal expansion with typical encapsulant materials. In various aspects, LED packages may also be configured with one or more apertures that allow air flow between an interior volume of a cavity and an ambient environment outside the LED package to promote further heat dissipation at higher drive currents.

The terms "solid-state light emitter" or "solid-state emitter" (which may be qualified as being "electrically activated") may include an LED, laser diode, organic LED, and/or other semiconductor device which includes one or more semiconductor layers, which may include silicon (Si), silicon carbide (SiC), gallium nitride (GaN) and/or other semiconductor materials, a substrate which may include sapphire, Si, SiC and/or other microelectronic substrates, and one or more contact layers which may include metal and/or other conductive materials.

Solid-state light emitters, such as LEDs or LED chips, typically comprise an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition (MOCVD). The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including but not limited to, buffer layers, nucleation layers, super lattice structures, undoped layers, cladding layers, contact layers, current-spreading layers, and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of active LED structures can emit different wavelengths of light depending on the composition of the active layer and n-type and p-type layers. For example, the active LED structure for various LEDs may emit blue light with a peak wavelength range of approximately 430 nanometers (nm) to 480 nm, green light with a peak wavelength range of 500 nm to 570 nm, or red or red-orange light with a peak wavelength range of 600 nm to 650 nm. In certain embodiments, red light may include a peak wavelength range of 600 nm to 700 nm, or 650 nm to 700 nm depending on the application. The LED chip can also be covered with one or more lumiphoric materials or other conversion materials, such as phosphors, such that at least some of the light from the LED chip is absorbed by the one or more lumiphoric materials and is converted to one or more different wavelength spectra according to the characteristic emission from the one or more lumiphoric materials. In certain embodiments, the combination of the LED chip and the one or more lumiphoric materials provides generally white or near white aggregate light emissions. Such lumiphoric materials may include one or more phosphors such as yellow (e.g., YAG:Ce), green (e.g., LuAg:Ce), and red (e.g., $Ca_{i-x-y}Sr_xEu_yAlSiN_3$) emitting phosphors, and combinations thereof. In certain embodiments, aggregate emissions of one or more LEDs, optionally in combination with one or more lumiphoric materials, may be arranged to provide cool white, neutral white, or warm white light, such as within a color temperature range of from 2500K to 10,000K. In certain embodiments, lumiphoric materials having various combinations of one or more cyan, green, amber, yellow, orange, and red dominant or peak wavelengths may be used.

As used herein, lumiphoric materials (which may also be known as lumiphors and/or luminescent materials) are configured to absorb a portion of emissions having a first peak wavelength emitted by a solid-state emitter and re-emit light having a second peak wavelength that differs from the first peak wavelength. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips.

Light emitted by the active layer or region of the LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer may be arranged between the metal reflector layer and first and second electrical contacts, wherein the first electrical contact is arranged in conductive electrical communication with a first semiconductor layer, and the second electrical contact is arranged in conductive electrical communication with a second semiconductor layer. In certain embodiments, the first and second electrical contacts themselves may be configured as mirror layers. For single or multi-layer mirrors including surfaces exhibiting less than 100% reflectivity, some light may be absorbed by the mirror. Additionally, light that is redirected through the active LED structure may be absorbed by other layers or elements within the LED chip. External reflective surfaces may include one or more reflective surfaces of LED packages, lighting fixtures, and lighting housings.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In certain embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (for example, at least 80% reflective) may be considered a reflective material. In the case of ultraviolet (UV) LEDs, appropriate materials may be selected to provide a desired, and in certain embodiments high, reflectivity, and/or a desired, and in certain embodiments low, absorption. In certain embodiments, a "light-transmissive" material may be configured to transmit at least 50% of emitted radiation of a desired wavelength. In certain embodiments, an initially "light-transmissive" material may be altered to be a "light-absorbing material" that transmits less than 50% of emitted radiation of a desired wavelength with the addition of one or more light-absorbing materials, such as opaque or non-reflective materials including grey, dark, or black particles or materials.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side or face of the LED chip that is opposite a substrate, such as a growth substrate. In an LED package, a lateral geometry LED chip may be mounted on a submount of the LED package such that the anode and cathode are on a face of the active LED structure that is opposite the submount. In this arrangement, wirebonds may be used to provide electrical connections with the anode and cathode. Certain embodiments disclosed herein relate to the use of flip chip LED devices in which a light transmissive substrate represents an exposed light-emitting surface. In such arrangements, the anodes and cathodes of LED chips that are flip-chip mounted may be mounted or bonded to electrical traces or patterns on the submount of the corresponding LED package. LED packages as disclosed herein may include arrangements that include one or more of submounts, electrical connections, light-altering materials, reflective materials, encapsulants, lenses, optics, and lumiphoric materials on or supporting one or more LED chips.

Embodiments of the disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Common elements between figures may be shown herein with common element numbers and may not be subsequently re-described.

Embodiments as disclosed herein may be useful for LED packages that are capable of providing a number of changeable, selectable, or tunable emission characteristics that are generated from a common LED package. Such LED packages may be configured to provide a number of different light emission zones or surfaces that are separately controllable or selectable. In this regard, the different light emission zones or surfaces may be operated separately from one another in a manner that is similar to separately packaged LEDs in close proximity to one another. In certain applications, size and spacing limitations can make it impractical to use separately packaged LEDs. For example, in certain automotive applications, it may be desirable to configure exterior lighting devices under a common lens or optic that are capable of changing between different correlated color temperatures (CCTs) that correspond with day time and night time running conditions. For general lighting applications, individual LED packages as disclosed herein may be configured to change between different emission colors or CCT values, such as one or more of warm white (e.g., 2700 Kelvin (K)-3000 K), neutral white (e.g., 3500 K-4500 K), and cool white (5000 K-6500 K). For horticulture lighting applications, individual LED packages as disclosed herein may be configured to change between different emission characteristics that target various growth conditions of different crops.

LED packages are described herein that may include various arrangements of LED chips on submounts. The submount can be formed of many different materials with an exemplary material being electrically insulating. Suitable materials include, but are not limited to ceramic materials such as aluminum oxide or alumina, AlN, or organic insulators like polyimide (PI) and polyphthalamide (PPA). In other embodiments, the submount can comprise a printed circuit board (PCB), sapphire, Si or any other suitable material. For PCB embodiments, different PCB types can be used such as a standard FR-4 PCB, a metal core PCB, or any other type of PCB.

In certain embodiments, light-altering materials are provided that may be arranged to divide different lumiphoric materials and LED chips on a common submount. The light-altering material may be adapted for dispensing, or placing, and may include many different materials including light-reflective materials that reflect or redirect light, light-absorbing materials that absorb light, and materials that act as a thixotropic agent. As used herein, the term "light-reflective" refers to materials or particles that reflect, refract, or otherwise redirect light. For light-reflective materials, the light-altering material may include at least one of fused silica, fumed silica, titanium dioxide ($TiO_2$), or metal particles suspended in a binder, such as silicone or epoxy. For light-absorbing materials, the light-altering material may include at least one of carbon, silicon, or metal particles suspended in a binder, such as silicone or epoxy. The light-reflective materials and the light-absorbing materials may comprise nanoparticles.

In certain embodiments, the light-altering material includes both light-reflective material and light-absorbing material suspended in a binder. A weight ratio of the light-reflective material to the binder may comprise a range of about 1:1 to about 2:1. A weight ratio of the light-absorbing material to the binder may comprise a range of about 1:400 to about 1:10. In certain embodiments, a total weight of the light-altering material includes any combination of the binder, the light-reflective material, and the light-absorbing material. In some embodiments, the binder may comprise a weight percent that is in a range of about 10% to about 90% of the total weight of the light-altering material. The light-reflective material may comprise a weight percent that is in a range of about 10% to about 90% of the total weight of the light-altering material. The light-absorbing material may comprise a weight percent that is in a range of about 0% to about 15% of the total weight of the light-altering material.

In further embodiments, the light-absorbing material may comprise a weight percent that is in a range of about greater than 0% to about 15% of the total weight of the light-altering material. In further embodiments, the binder may comprise a weight percent that is in a range of about 25% to about 70% of the total weight of the light-altering material. The light-reflective material may comprise a weight percent that is in a range of about 25% to about 70% of the total weight of the light-altering material. The light-absorbing material may comprise a weight percent that is in a range of about 0% to about 5% of the total weight of the light-altering material. In further embodiments, the light-absorbing material may comprise a weight percent that is in a range of about greater than 0% to about 5% of the total weight of the light-altering material.

In certain embodiments, the light-altering material may comprise a generally white color to reflect and redirect light. In other embodiments, the light-altering material may comprise a generally opaque or black color for absorbing light and increasing contrast of an LED package. The light-altering material can be dispensed or deposited in place using an automated dispensing machine where any suitable size and/or shape can be formed. The light-altering material may have a viscosity configured to be dispensed around a perimeter of an LED chip and surface tension will keep the light-altering material off of a primary emitting surface of the LED chip. Additionally, the light-altering material may wick in between adjacent LED chips that are separated by narrow lateral distances.

LED packages typically include arrangements where one or more LEDs are mounted on a submount and directly encapsulated with an encapsulant material. In various configurations, encapsulant materials may also form optical shapes such as lenses for directing light emissions. A common encapsulant material is silicone that may be provided on LEDs and corresponding electrical connections. In this manner, encapsulant materials typically fill open spaces over and around LEDs that are mounted on a submount to provide environmental protection and mechanical support. When electrically activated, LEDs are known to generate heat, particular with increasing drive currents associated with higher light outputs. Additionally, thermal cycling may occur due to LEDs being electrically activated and deactivated over time during operation. Exposure to increased heat and thermal cycling can lead to degradation of encapsulant materials and/or failure of electrical connections such as wire bonds that may be present. In particular, coefficient of thermal expansion differences between encapsulant materials, LEDs, electrical connections, and underlying submount materials can create strain in the corresponding materials with increased heat and thermal cycling. In this regard, typical LED packages are rated with drive current limits per LED chip to avoid such degradation and failure mechanisms.

According to aspects disclosed herein, LED packages are provided with reduced encapsulant materials that contribute to degradation and failure mechanisms associated with conventional devices. In certain embodiments, LED packages may include one or more open spaces that reduce contact between LED chips and other elements of the LED package. By way of example, an open space or cavity may be formed between a lens and a submount and LED chips may reside in the cavity without being directly encapsulated. As used herein, "directly encapsulated" refers to a particular element that is embedded within another material, such as an encapsulant material. For example, in typical LED packages, an LED chip and a corresponding wire bond may be directly encapsulated if they are embedded within a silicone encapsulant. Directly encapsulated may also include partially embedded arrangements, such as if portions of an LED chip or a wire bond protrude out of an encapsulant material while other portions of the LED chip or wire bond are embedded. In various arrangements, the cavity may be configured to allow air flow between an interior volume of the cavity and an ambient environment outside the LED package. By not embedding the LED chips in conventional encapsulant materials, the LED chips and corresponding electrical connections such as wire bonds may be subjected to increased drive currents with reduced impact related to coefficient of thermal expansion differences.

Figure 1:
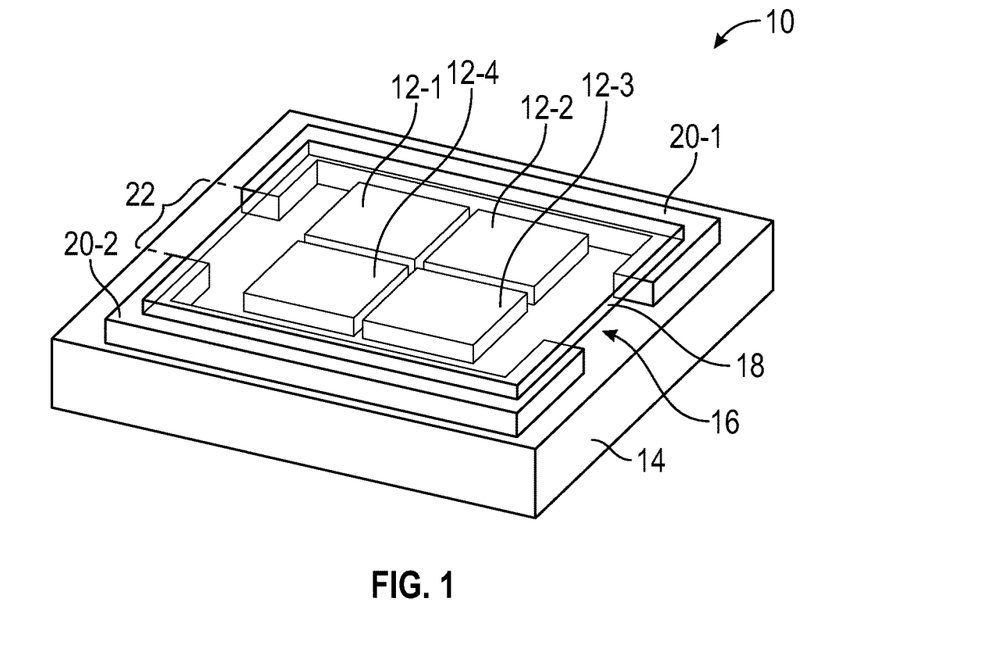
FIG. 1 is a perspective view of a light-emitting diode (LED) package that includes one or more LED chips on a submount and within a cavity that is formed between a lens and the submount.

FIG. 1 is a perspective view of an LED package 10 that includes one or more LED chips 12-1 to 12-4 on a submount 14 and within a cavity 16 that is formed between a lens 18 and the submount 14. As illustrated, the lens 18 is positioned over the submount 14 and the LED chips 12-1 to 12-4 to form the cavity 16. In certain embodiments, the cavity 16 is open to air flow with an ambient environment outside the LED package 10. The lens 18 may be formed in a spaced manner from the LED chips 12-1 to 12-4. In this manner, the LED chips 12-1 to 12-4 may be in contact with only the underlying submount 14, thereby reducing effects of heat generated by the LED chips 12-1 to 12-4 on other elements of the LED package 10 during operation. In certain embodiments, the LED package 10 may be devoid of encapsulant materials that would typically directly encapsulate the LED chips 12-1 to 12-4.

The lens 18 may comprise various materials such as at least one of glass, plastic, and ceramic materials that are light-transmissive to wavelengths of light generated by the LED chips 12-1 to 12-4 and any associated lumiphoric materials such as phosphors. In certain embodiments, the lens 18 is a pre-formed structure that is attached to the LED package 10. For example, the lens 18 may comprise glass or silicone materials that are pre-hardened or cured before being assembled in the LED package 10. In FIG. 1, the lens 18 is illustrated with a substantially flat or planar shape. Depending on a targeted light distribution pattern for the LED package 10, the lens 18 may form other shapes, such as a hemispherical or dome shape, a hemispherical shape with planar side surfaces, a cubic shape, and a shape with a planar top surface. In various embodiments, the lens 18 may comprise a light-transmissive superstrate that supports one or more lumiphoric materials. For example, the one or more lumiphoric materials may be provided as a coating on a surface of the light-transmissive superstrate or the one or more lumiphoric materials may be embedded within the light-transmissive superstrate. In other examples the lens 18 may embody a ceramic phosphor plate.

In order to provide suitable spacing to form the cavity 16, one or more spacers 20-1, 20-2 may be arranged on the submount 14 such that the lens 18 is supported by the spacers 20-1, 20-2. As illustrated, the spacers 20-1, 20-2 may be arranged under and along one or more peripheral edges and/or corners of the lens 18, thereby forming portions of the cavity 16. The spacers 20-1, 20-2 may be arranged on portions of the submount 14 that are spaced from the LED chips 12-1 to 12-4 with heights that are greater than heights of the LED chips 12-1 to 12-4, thereby forming the cavity 16 above the LED chips 12-1 to 12-4 and adjacent side edges of the LED chips 12-1 to 12-4. In certain embodiments, the spacers 20-1, 20-2 may be discontinuously arranged along the lens 18, thereby forming one or more apertures 22 that allow air flow between an interior volume of the cavity 16 and an ambient environment outside the LED package 10. In this manner, such air flow may provide heat dissipation for the LED chips 12-1 to 12-4 in operation. In certain embodiments, a plurality of apertures 22 may be formed such as the example of FIG. 1, where two apertures 22 are formed at or near opposing peripheral edges of the lens 18. While two apertures 22 are shown, any number of apertures 22 may be formed without deviating from the principles of the present disclosure. Depending on the application, the LED package 10 may be provided within a chamber of a larger fixture or module that is sealed for protection from environmental exposure. In this regard, the apertures 22 may allow air flow with the ambient environment within the chamber of the fixture that is outside of the LED package 10 without subjecting the LED package 10 to harmful environmental exposure of moisture or other atmospheric chemicals such as sulfur.

The spacers 20-1, 20-2 may comprise many different materials, including one or more combinations of ceramic, plastic, and metals that form risers that separate the lens 18 from the LED chips 12-1 to 12-4 and portions of the underlying submount 14. In certain embodiments, the spacers 20-1, 20-2 may comprise a host material with additives that provide additional properties, such as added mechanical strength. The spacers 20-1, 20-2 may comprise a pre-formed structure that is adhered to the submount 14 or the spacers 20-1, 20-2 may be formed on the submount 14. In one example, the spacers 20-1, 20-2 comprise silicone that may either be dispensed and cured on the submount 14 or pre-cured and attached to the submount 14. Depending on a desired emission pattern for the LED package 10, the spacers 20-1, 20-2 may comprise one or more light-altering materials such as light-reflecting materials configured to reflect or otherwise redirect light emissions in a targeted direction and/or light-absorbing materials that are configured to increase contrast for the LED package 10. The spacers 20-1, 20-2 may also comprise materials that are light-transmissive to wavelengths of light from the LED chips 12-1 to 12-4 and any associated lumphoric materials. As illustrated in FIG. 1, the lens 18 may reside on top surfaces of the spacers 20-1, 20-2. In this manner, the spacers 20-1, 20-2 may first be formed or adhered to the submount 14, and the lens 18 may be subsequently attached or adhered to the spacers 20-1, 20-2. As will further be described below for FIG. 2, other arrangements may include portions of the lens 18 being at least partially embedded within the spacers 20-1, 20-2.

In FIG. 1, the LED package 10 is illustrated with four LED chips 12-1 to 12-4. In certain embodiments, the LED chips 12-1 to 12-4 may each provide emissions of different wavelengths. For example, the LED chip 12-1 may provide predominantly blue emissions, the LED chip 12-2 may provide predominantly green emissions, the LED chip 12-3 may provide predominantly red emissions, and the LED chip 12-4 may provide predominantly white emissions (e.g., a blue LED chip with a lumiphoric material provided thereon). When configured to provide predominantly white emissions, corresponding ones of the LED chips 12-1 to 12-4 may be configured as a chip with a phosphor coating that is deposited or sprayed at a chip level or after mounting to the submount 14. Alternatively, white emissions may be provided by positioning a separate cover (e.g., a superstrate) that includes phosphor materials over the corresponding LED chip 12-1 to 12-4. In this regard, the LED chips 12-1 to 12-4 may generate different amounts of heat during operation and by arranging the LED chips 12-1 to 12-4 within the cavity 16 without direct encapsulation, localized hot spots in conventional encapsulation materials may be avoided. In other embodiments, one or more of the LED chips 12-1 to 12-4 may be configured to provide the same or similar light emissions, such as all of the LED chips 12-1 to 12-4 being configured to provide white light. In still further embodiments, certain ones of the LED chips 12-1 to 12-4 may be configured to provide white emissions having a certain color temperature (e.g., cool white) whiles others of the LED chips 12-1 to 12-4 may be configured to provide white emissions of a different color temperature (e.g., warm white). While four LED chips 12-1 to 12-4 are illustrated, the principles disclosed herein are also applicable to different numbers of LED chips, including LED packages with a single LED chip.

Figure 2:
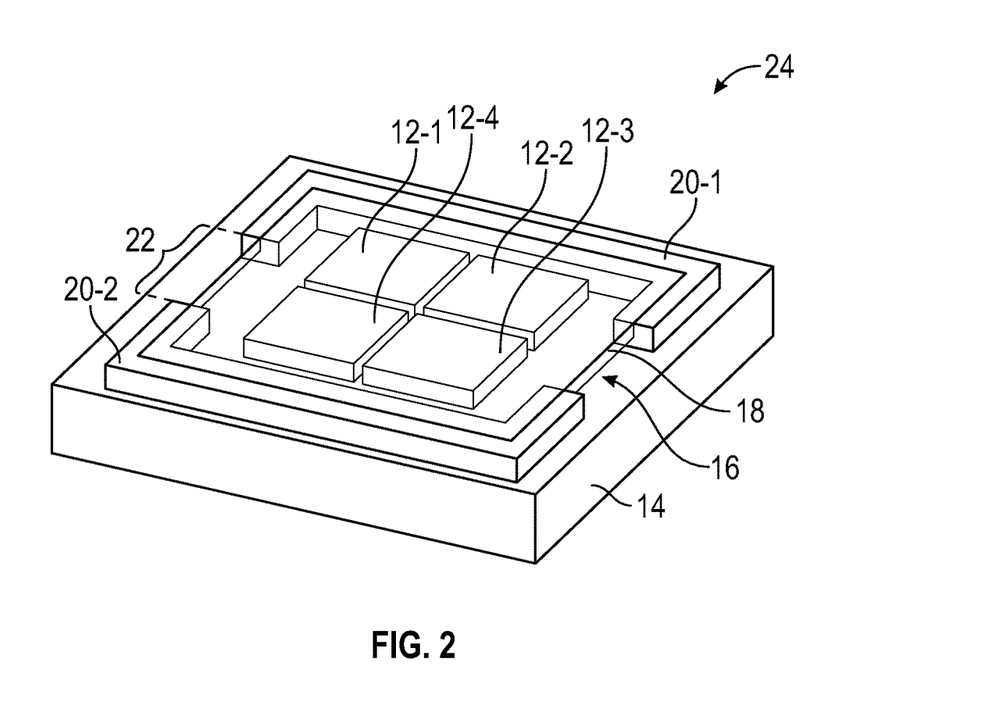
FIG. 2 is a perspective view of an LED package that is similar to the LED package of FIG. 1 and further includes an arrangement where portions of the lens are at least partially embedded in spacers.

FIG. 2 is a perspective view of an LED package 24 that is similar to the LED package 10 of FIG. 1 and further includes an arrangement where portions of the lens 18 are at least partially embedded in the spacers 20-1, 20-2. The spacers 20-1, 20-2 may be arranged under and along one or more peripheral edges and/or corners of the lens 18, thereby forming portions of the cavity 16 in a similar manner as described for FIG. 1. As illustrated in FIG. 2, one or more portions of the lens 18 may extend into portions of the spacers 20-1, 20-2. In this manner, the spacers 20-1, 20-2 may support the lens 18 and serve to adhere the lens 18 to the submount 14. By way of example, the spacers 20-1, 20-2 may comprise silicone that is dispensed along the submount 14 and the lens 18 may be positioned on the spacers 20-1, 20-2 such that portions of the lens 18 are partially embedded within the silicone before the silicone is cured in place. In various configurations, a top surface of the lens 18 may be coplanar with top surfaces of the spacers 20-1, 20-2 while still forming the cavity 16. In further configurations the top surface of the lens 18 may be arranged above or below the top surfaces of the spacers 20-1, 20-2 while still forming the cavity 16.

Figure 3A:
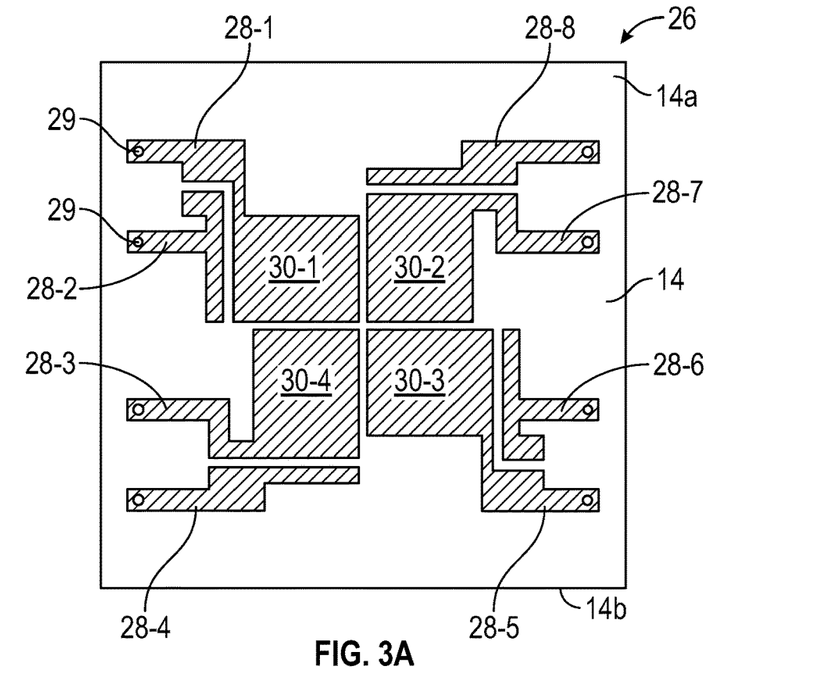
FIG. 3A is a topside view of an LED package before LED chips are mounted, illustrating electrical traces on a first face of a submount.
Figure 3B:
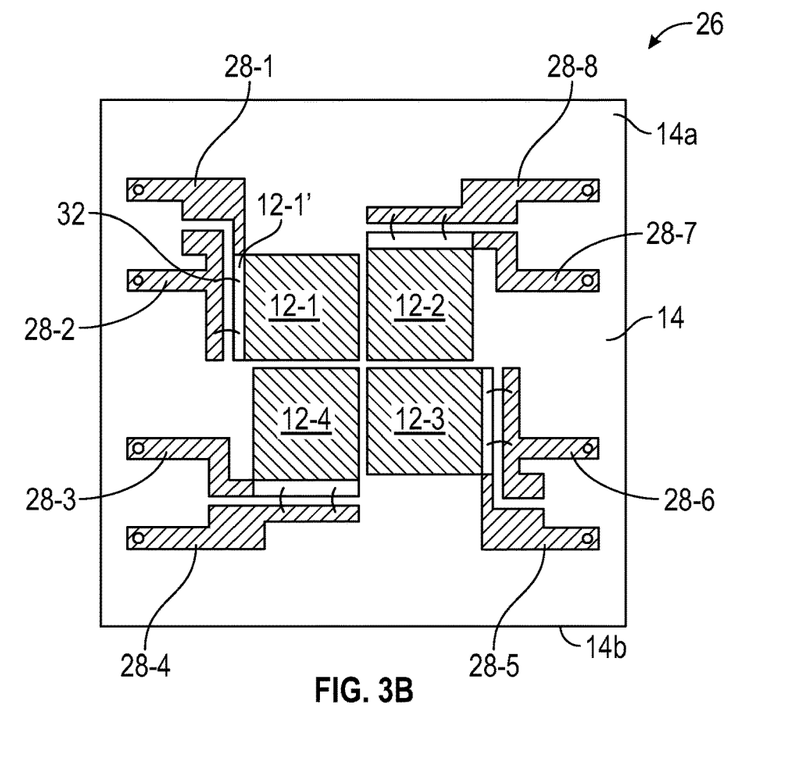
FIG. 3B is a topside view of the LED package of FIG. 3A after LED chips are mounted.

FIGS. 3A-3E illustrate views of an LED package 26 at various states of assembly. The LED package 26 may be configured in a similar manner as either the LED package 10 of FIG. 1 or the LED package 24 of FIG. 2. FIG. 3A is a topside view of the LED package 26 before LED chips 12-1 to 12-4 are mounted. In this regard, FIG. 3A is a view taken from a first face 14a of the submount 14 that will support the LED chips 12-1 to 12-4. A second face 14b of the submount 14 that opposes the first face 14a is not visible in FIG. 3A. A plurality of electrical traces 28-1 to 28-8 are arranged on the first face 14a of the submount 14, and each electrical trace 28-1 to 28-8 includes a continuous metal or electrically conductive material formed on the first face 14a. As illustrated, each electrical trace 28-1 to 28-8 is discontinuous with one another. Pairs of electrical traces (e.g., 28-1 and 28-2, 28-3 and 28-4, etc.) form anode and cathode connections for each of the LED chips 12-1 to 12-4 as illustrated in FIG. 3B. One or more of the electrical traces 28-1 to 28-8 may be electrically coupled to one or more vias 29 that extend through the submount 14 to provide electrical connections between the first face 14a and the second face 14b. Certain portions of the electrical traces 28-1, 28-3, 28-5, and 28-7 form a plurality of die attach pads 30-1 to 30-4, or a plurality of mounting areas, that are centrally located on the first face 14a.

The die attach pads 30-1 to 30-4 are configured to receive the LED chips 12-1 to 12-4 as illustrated in FIG. 3B. By way of example, the LED chip 12-1 may comprise a bottom side cathode contact that is mounted and electrically coupled to the die attach pad 30-1 of the electrical trace 28-1 and a topside anode contact that is electrically coupled to the electrical trace 28-2 by way of one or more wire bonds 32. In FIG. 3B, two wire bonds 32 are illustrated that are electrically coupled between the LED chip 12-1 and the electrical trace 28-2. According to embodiments disclosed herein, any number of wire bonds 32 may be used for each LED chip 12-1 to 12-4. Additionally, one or more of the LED chips 12-1 to 12-4 may form a contact bar 12-1' that is configured to provide multiple wire bonds 32 to a common anode or cathode. The contact bar 12-1' may be formed along a portion of a substrate or submount of the LED chip 12-1 that is adjacent an active LED structure of the LED chip 12-1. For higher current applications, as many as four wire bonds 32 may be used. As illustrated, portions of each of the electrical traces 28-2, 28-4, 28-6, and 28-8 form buses that are adjacent to corresponding LED chips 12-1 to 12-4 to facilitate extra wire bond 32 connections. In other examples, the above-described anode and cathode polarities may be reversed depending on the configuration of the LED chip 12-1. In FIG. 3B, all LED chips 12-1 to 12-4 are illustrated as described above for the LED chip 12-1. In other embodiments, one or more of the LED chips 12-1 to 12-4 may be mounted with flip-chip mounting arrangements where anodes and cathodes of each of the LED chips 12-1 to 12-4 are mounted and electrically coupled to corresponding pairs of the electrical traces 28-1 to 28-8 without the use of wire bonds 32.

Figure 3C:
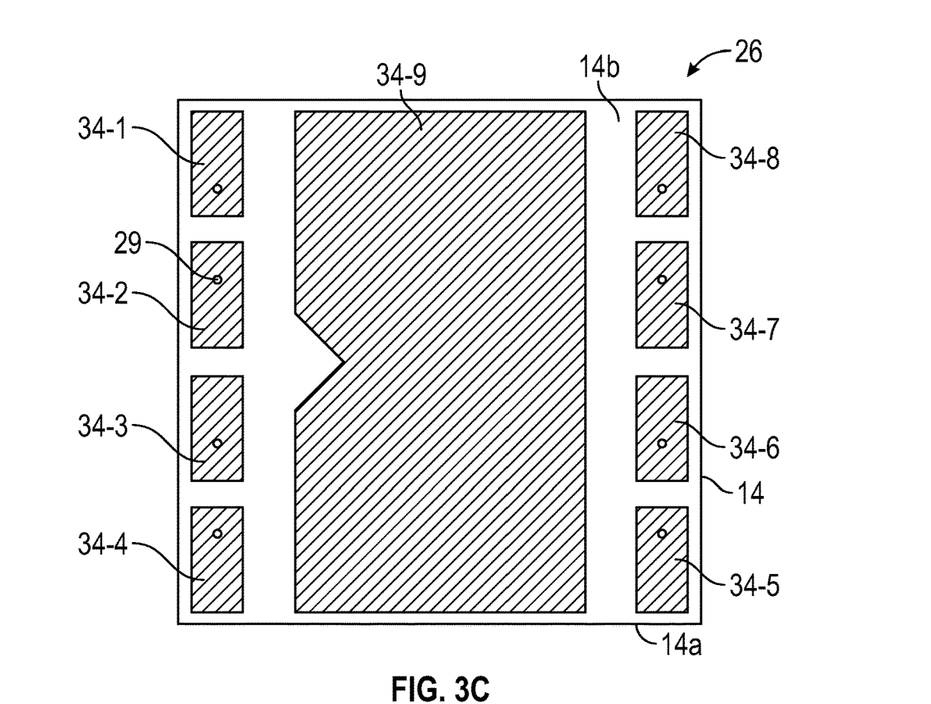
FIG. 3C is a backside view of the LED package of FIG. 3B illustrating a plurality of backside electrical traces on a second face of the submount.

FIG. 3C is a backside view of the LED package 26 of FIG. 3B illustrating a plurality of backside electrical traces 34-1 to 34-9 on the second face 14b of the submount 14. Each of the backside electrical traces 34-1 to 34-8 may be electrically coupled to corresponding ones of the electrical traces 28-1 to 28-8 by way of the vias 29. In certain embodiments, the electrical trace 34-9 may form a thermal pad for heat dissipation purposes. Accordingly, the electrical trace 34-9 may be electrically isolated from the LED chips 12-1 to 12-4 and may be formed with a larger area on the second face 14b than the other backside electrical traces 34-1 to 34-8. When the LED package 26 is mounted to another surface, such as a PCB or a housing of a lighting fixture or module, the electrical traces 34-1 to 34-8 are arranged to receive external electrical connections and the electrical trace 34-9 is configured to dissipate heat away from the LED chips 12-1 to 12-4. For higher current applications that may generate increased levels of heat, the electrical trace 34-9 serving as a thermal pad may also work in conjunction with air flow capabilities as described above to provide improved heat dissipation.

Figure 3D:
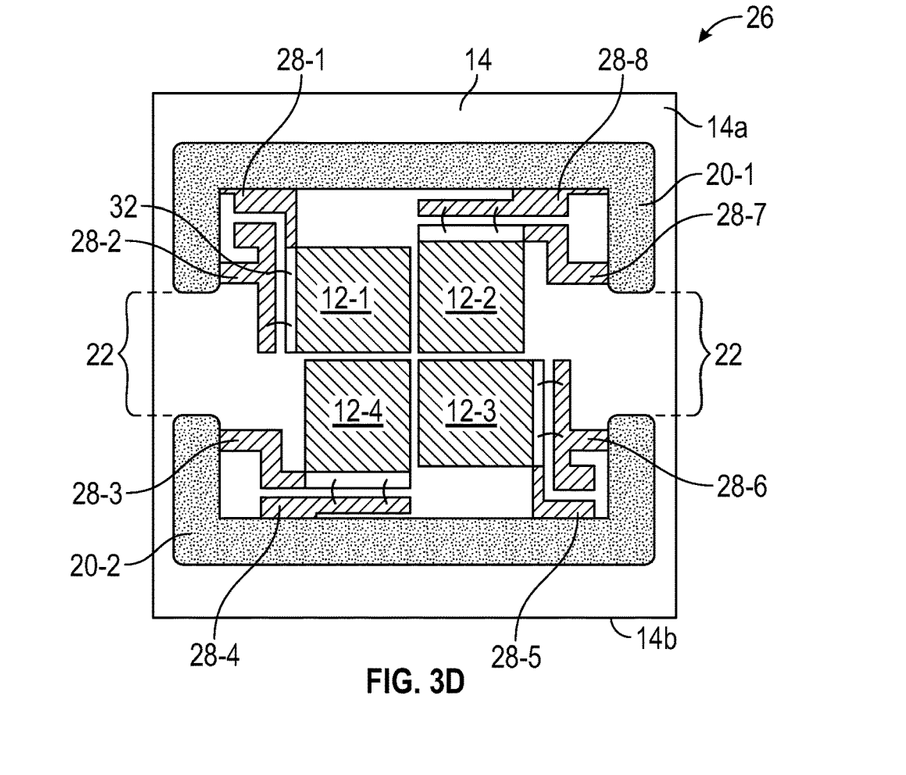
FIG. 3D is a topside view of the LED package of FIG. 3C after spacers are provided on the first face of the submount.
Figure 3E:
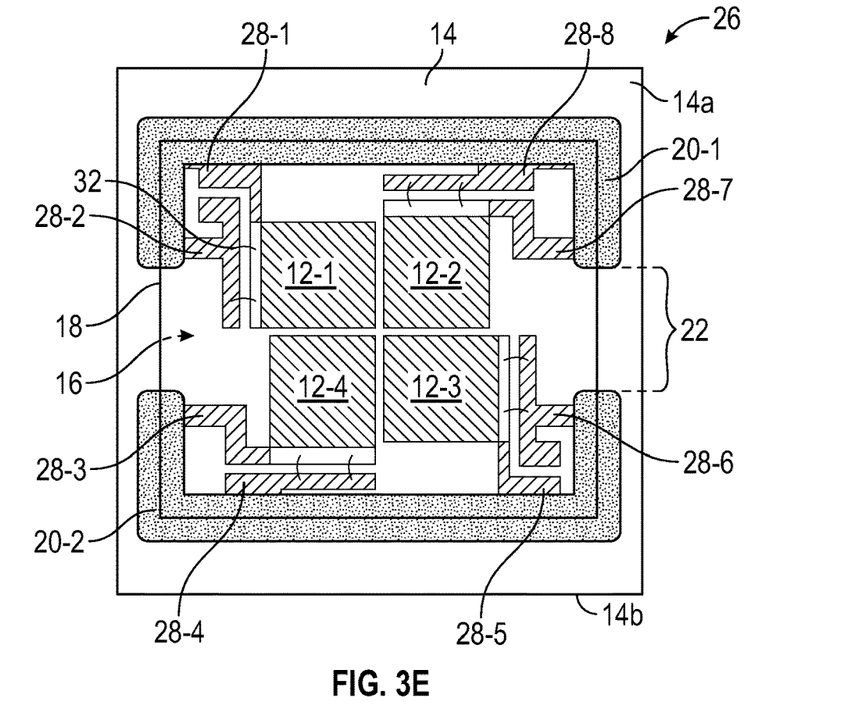
FIG. 3E is a topside view of the LED package of FIG. 3D after a lens is positioned on the spacers.

FIG. 3D is a topside view of the LED package 26 of FIG. 3C after the spacers 20-1, 20-2 are provided on the first face 14a of the submount 14. As illustrated the spacers 20-1, 20-2 may be formed on the first face 14a in a laterally spaced manner from peripheral edges of the LED chips 12-1 to 12-4, thereby defining lateral boundaries of the cavity 16 and apertures 22 once the lens 18 of FIG. 3E is provided. Additionally, the spacers 20-1, 20-2 may be formed to cover portions of each of the electrical traces 28-1 to 28-8. In particular embodiments, the spacers 20-1, 20-2 may be formed such that no portions of the electrical traces 28-1 to 28-8 are uncovered along portions of the first face 14a that are between the spacers 20-1, 20-2 and peripheral edges of the submount 14.

FIG. 3E is a topside view of the LED package 26 of FIG. 3D after the lens 18 is provided on the spacers 20-1, 20-2. As previously described, the lens 18 is supported by top surfaces of the spacers 20-1, 20-2 to form the cavity 16 that is vertically defined between the lens 18 and portions of the submount 14 and laterally defined by the spacers 20-1, 20-2. In this manner, the LED chips 12-1 to 12-4, any corresponding wire bonds 32, and uncovered portions of the electrical traces 28-1 to 28-8 are arranged within the cavity 16. Additionally, the apertures 22 are formed along discontinuous portions of the spacers 20-1, 20-2 between the lens 18 and the submount 14 to allow air flow between an interior volume of the cavity 16 and an ambient environment outside the LED package 26. As such, the LED chips 12-1 to 12-4 and any corresponding wire bonds 32 may be subjected to higher drive currents than otherwise possible if the LED chips 12-1 to 12-4 were directly encapsulated by conventional encapsulant materials such as silicone. By way of example, if conventional encapsulant materials were provided to directly encapsulate the LED chips 12-1 to 12-4 and any corresponding wire bonds 32, the LED package 26 may be rated for drive currents as high as 2 amps per LED chip. By forming the cavity 16 as illustrated, the LED package 26 may be rated for drive currents as high as 5 amps per LED chip, or in a range from 3 amps per chip to 5 amps per chip.

Figure 3F:
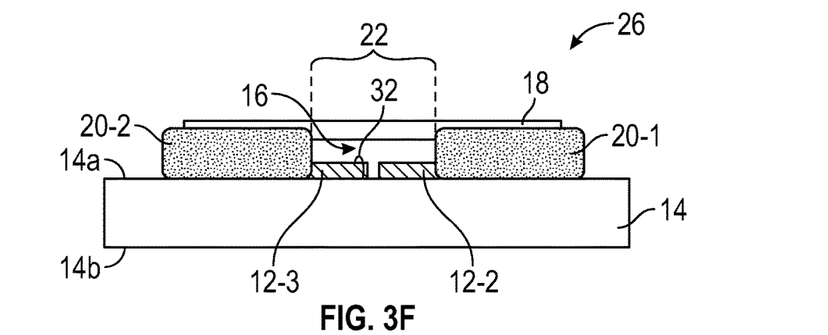
FIG. 3F illustrates a side view of the LED package of FIG. 3E for embodiments where portions of the lens are partially embedded within the spacers.
Figure 3G:
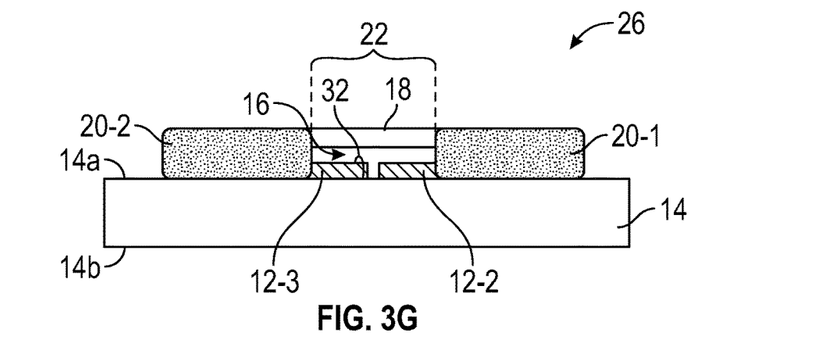
FIG. 3G illustrates a side view of the LED package of FIG. 3E for embodiments where portions of the lens are further embedded within the spacers.
Figure 3H:
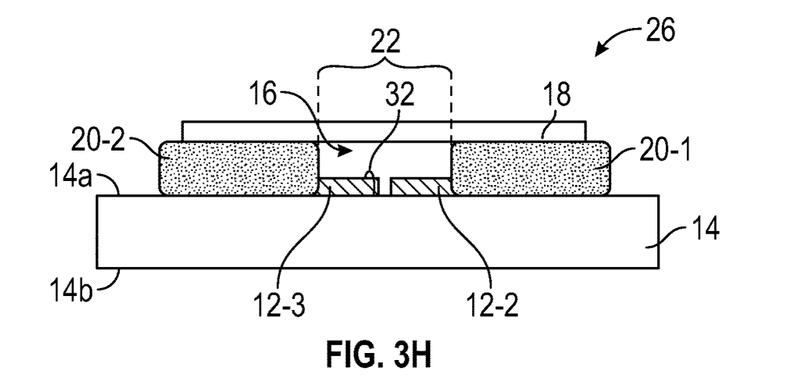
FIG. 3H illustrates a side view of the LED package of FIG. 3E for embodiments where the lens resides on top of the spacers.

FIGS. 3F-3H illustrate side views of the LED package 26 of FIG. 3E for different arrangements of the lens 18 relative to the spacers 20-1, 20-2. As illustrated, the side views of FIGS. 3F-3H are taken from the right side of the image of FIG. 3E. In this regard, the LED chips 12-2 and 12-3 are visible through the aperture 22 and within the cavity 16. In FIGS. 3F-3H, the aperture 22 is configured with a smaller lateral width relative to the first face 14a of the submount 14 than a lateral width of a footprint of the LED chips 12-2, 12-3. The lateral width of the aperture 22 may be configured with different dimensions in different applications to adjust air flow. In FIG. 3F, the lens 18 is partially embedded within the spacers 20-1, 20-2. As previously described, this may be accomplished by dispensing a material of the spacers 20-1, 20-2 and positioning the lens 18 before curing or hardening of the material of the spacers 20-1, 20-2. As illustrated, a top portion or surface of the lens 18 is arranged a distance that is farther away from the submount 14 than top surfaces of the spacers 20-1, 20-2, and a bottom portion or surface of the lens 18 that defines the cavity 16 is positioned below the top surfaces of the spacers 20-1, 20-2. FIG. 3G illustrates an alternative arrangement for the LED package 26 that is similar to FIG. 3F, but where the lens 18 is further embedded in the spacers 20-1, 20-2. As illustrated, the top portion or surface of the lens 18 may be arranged at or below the top surfaces of the spacers 20-1, 20-2 while still maintaining sufficient height to define portions of the cavity 16 above the LED chips 12-2, 12-3 and any corresponding wire bonds 32. In certain embodiments, a top surface of the lens 18 may be coplanar with the top surfaces of one or more of the spacers 20-1, 20-2. FIG. 3H illustrates yet another alternative arrangement for the LED package 26 where the lens 18 resides on top of the spacers 20-1, 20-2. In this regard, the spacers 20-1, 20-2 may be pre-formed or pre-hardened before positioning of the lens 18.

Figure 4:
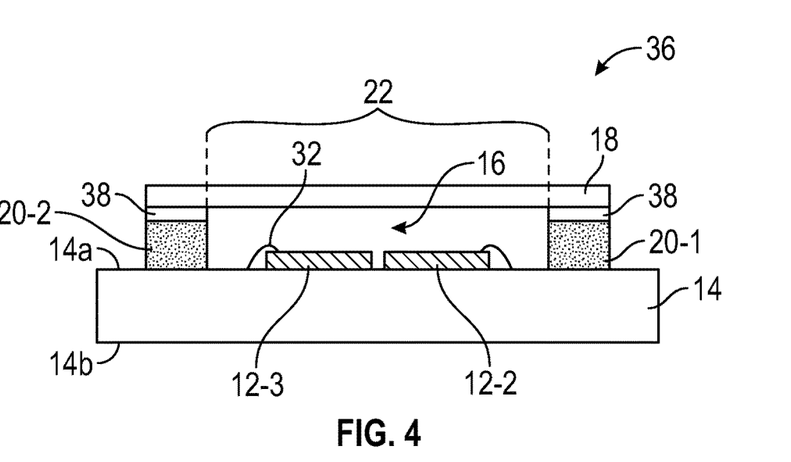
FIG. 4 is a side view of an LED package that is similar to the LED package of FIG. 3F and further illustrates an adhesive that is arranged between the lens and the spacers.

FIG. 4 is a side view of an LED package 36 that is similar to the LED package 26 of FIG. 3F and further illustrates an adhesive 38 that is arranged between the lens 18 and the spacers 20-1, 20-2. For embodiments, where the lens 18 is positioned on pre-cured or pre-hardened spacers 20-1, 20-2, the adhesive 38 may be provided to adhere the lens 18 to the spacers 20-1, 20-2. In certain embodiments, the adhesive 38 may comprise silicone materials or other types of glues or resins. As further illustrated in FIG. 4, the aperture 22 may be configured with a larger size in various applications to allow even more air flow. For example, the aperture 22 is arranged with a larger lateral width relative to the first face 14a than a lateral width of the footprint of the LED chips 12-3, 12-2.

Figure 5:
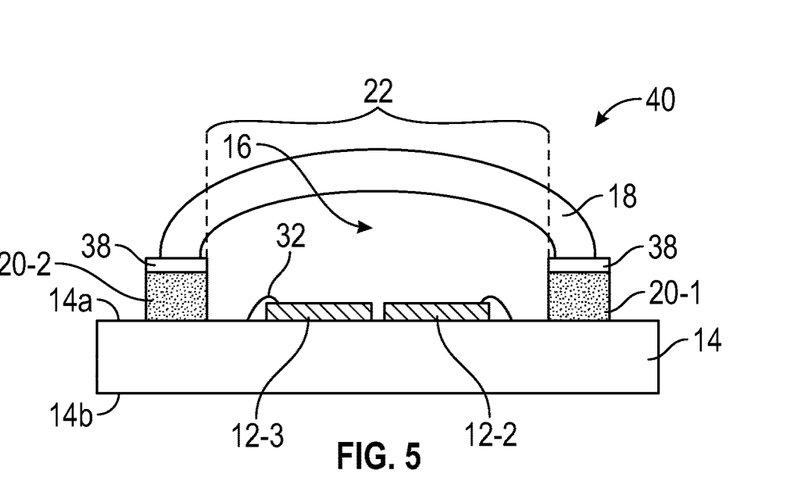
FIG. 5 is a side view of an LED package that is similar to the LED package of FIG. 4 except that the lens is configured with a nonplanar shape.

FIG. 5 is a side view of an LED package 40 that is similar to the LED package 36 of FIG. 4 except that the lens 18 is configured with a nonplanar shape. As illustrated, the lens 18 forms a curved shape above the submount 14 for tailoring light emissions generated by the LED chips in a desired emission pattern. The lens 18 may form a dome-shaped shell structure with inner and outer surfaces that are both curved relative to the submount 14. In alternative embodiments, the lens 18 may form a dome-shaped structure with a curved outer surface that is distal to the submount 14 and a planar or textured surface that is proximal to the submount 14. For the dome-shaped shell structure as illustrated in FIG. 5, the cavity 16 is accordingly formed in a curved manner as defined by the shape of the lens 18. The lens 18 may be adhered to the spacers 20-1, 20-2 with the adhesive 38 as illustrated in FIG. 5 or by embedding portions of the lens 18 within the spacers 20-1, 20-2 as illustrated in FIGS. 3F and 3G. The aperture 22 may be configured with different lateral widths as previously described depending on the desired air flow for particular applications.

Figure 6:
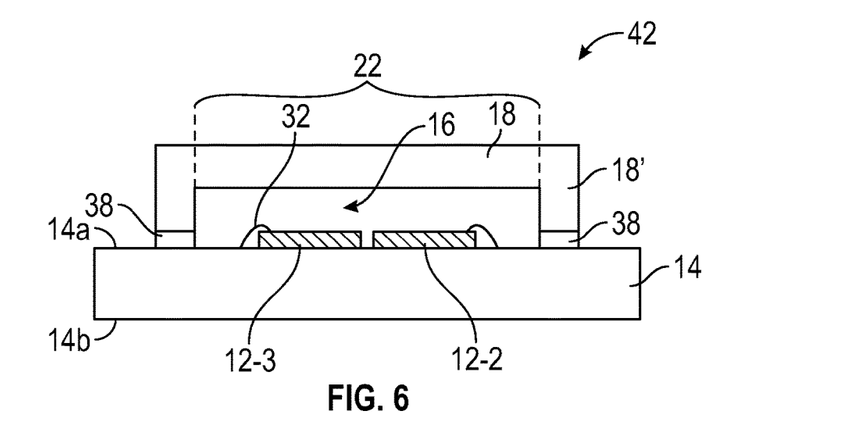
FIG. 6 is a side view of an LED package where a lens is configured with a shape that defines a cavity and an aperture without separate spacers of previous embodiments.

FIG. 6 is a side view of an LED package 42 where the lens 18 is configured with a shape that defines the cavity 16 and the aperture 22 without separate spacers of previous embodiments. As illustrated, the lens 18 includes portions 18' that are adhered to the submount 14 and other portions that extend over the LED chips 12-2, 12-3 to form the cavity 16. In this manner, the lens portions 18' may effectively form or replace the spacers (20-1, 20-2) of previous embodiments to form the lens 18 and spacer functions as a continuous single piece element for the LED package 42. In this regard, the lens 18 of any of the embodiments of the present disclosure may further include the lens portions 18' that form or replace the function of the spacers (20-1, 20-2) as described herein. The lens portions 18' may be adhered to the submount 14 with the adhesive 38 as previously described. In certain embodiments, the lens portions 18' may extend below a horizontal plane defined by a top surface of at least one of the LED chips 12-1 to 12-3. In FIG. 6, the lens 18 is illustrated with a planar top surface with vertically oriented lens portions 18'. In other embodiments, the lens 18 may include one or more textured surfaces. In still further embodiments, the lens 18 may include other shapes, such as a hemispherical or dome shape, a hemispherical shape with planar side surfaces, a cubic shape, and other shapes with a planar top surface. The aperture 22 may be configured with different lateral widths as previously described depending on the desired air flow for particular applications.

FIGS. 7A-11B illustrate various arrangements of the lens 18 and spacers 20-1 to 20-4 relative to the submount 14 according to various principles of the present disclosure. In particular, the various arrangements illustrate how relative sizes of the corresponding apertures 22 may be tailored for different air flow applications. In each of the FIGS. 7A-11B, the lens 18 and spacers 20-1 to 20-4 are illustrated as separate elements, however the lens 18 and spacers 20-1 to 20-4 could also be formed as a continuous single piece element as described for the LED package 42 of FIG. 6. In this manner, the lens 18 in any of FIGS. 7A-11B may include lens portions (18' of FIG. 6) in place of the spacers 20-1 to 20-4 without deviating from the principles disclosed. For illustrative purposes, one or more LED chips 12 are indicated in a simplified manner. The one or more LED chips 12 may embody a single LED chip or a plurality of LED chips 12 that are arranged within a footprint of the area designated as the one or more LED chips 12 in FIGS. 7A-11B. The apertures 22 as illustrated in FIGS. 7A-11B may be configured to allow air flow between the cavities 16 and ambient environments that are external to the cavities 16. As previously described, the ambient environments may embody a chamber of a larger lighting fixture or module that is sealed in order to prevent harmful moisture or atmospheric gases such as sulfur from reaching the cavities 16.

Figure 7A:
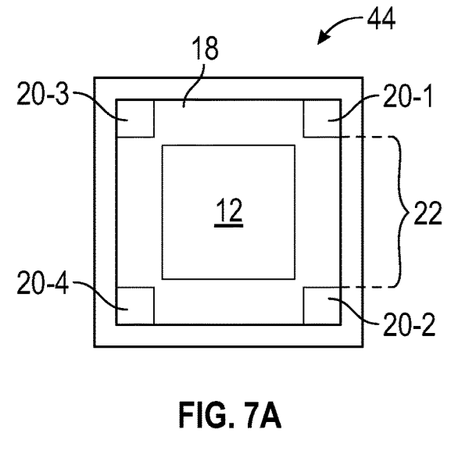
FIG. 7A is a top view of an LED package where spacers are arranged as pedestals or columns at corners of a lens.
Figure 7B:
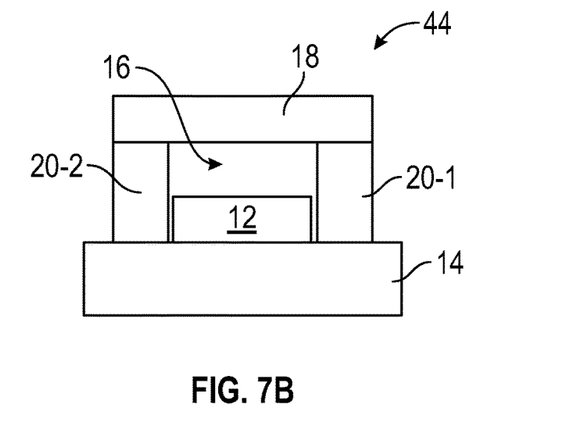
FIG. 7B is a side view that is oriented from the right side of the LED package of FIG. 7A.

FIG. 7A is a top view of an LED package 44 where spacers 20-1 to 20-4 are arranged as pedestals or columns at corners of the lens 18. FIG. 7B is a side view that is oriented from the right side of the LED package 44 of FIG. 7A. As illustrated, the spacers 20-1 to 20-4 are positioned at four corners of the lens 18, thereby supporting the lens 18 above the submount 14 and the one or more LED chips 12. The cavity 16 is formed between the lens 18 and the submount 14 and the one or more LED chips 12 reside within the cavity 16. By only arranging the spacers 20-1 to 20-4 at the four corners of the lens 18, the corresponding apertures 22 are formed with large lateral dimensions along the four lateral edges of the lens 18. In certain embodiments, lateral dimensions of the apertures 22 may be formed wider than the area occupied by the one or more LED chips 12. In this manner, the apertures 22 may be configured to allow increased air flow between the cavity 16 and the ambient environment outside of the LED package 44.

Figure 8A:
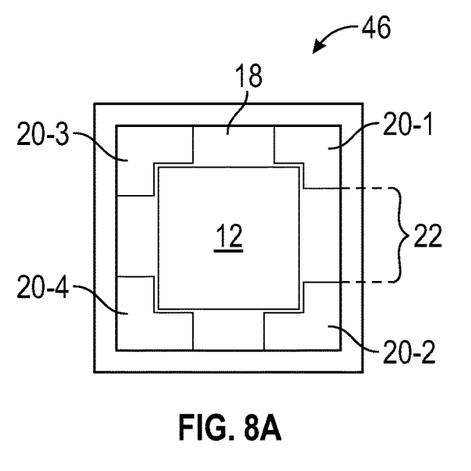
FIG. 8A is a top view of an LED package where spacers are arranged as pedestals or columns at corners of a lens and the spacers are further arranged to extend along edges of the lens in directions away from the corners.
Figure 8B:
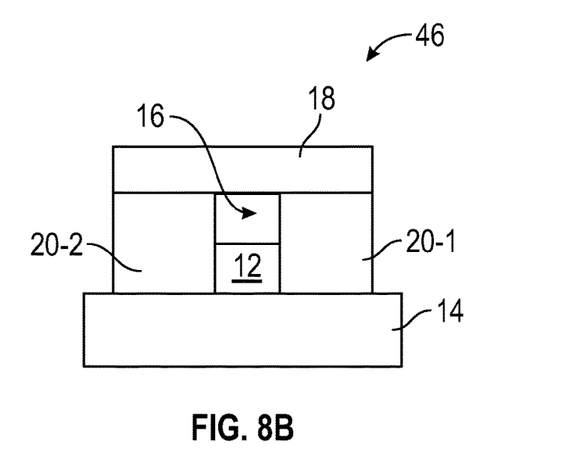
FIG. 8B is a side view that is oriented from the right side of the LED package of FIG. 8A.

FIG. 8A is a top view of an LED package 46 where spacers 20-1 to 20-4 are arranged as pedestals or columns at corners of the lens 18 and the spacers 20-1 to 20-4 are further arranged to extend along side edges of the lens 18 in directions away from the corners. FIG. 8B is a side view that is oriented from the right side of the LED package 46 of FIG. 8A. By extending the spacers 20-1 to 20-4 from each of the four corners of the lens 18 as illustrated, the corresponding apertures 22 may be formed with reduced size compared with the embodiments of FIGS. 7A and 7B. In certain embodiments, lateral dimensions of the apertures 22 may be formed narrower than the area occupied by the one or more LED chips 12. In this manner, the apertures 22 may be configured to allow somewhat decreased air flow between the cavity 16 and the ambient environment outside of the LED package 44.

Figure 9A:
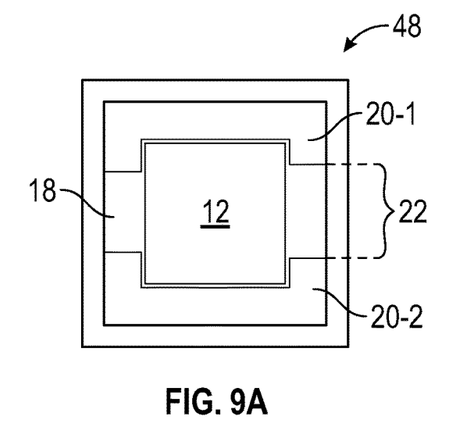
FIG. 9A is a top view of an LED package where spacers are arranged to extend continuously along two opposing edges of a lens.
Figure 9B:
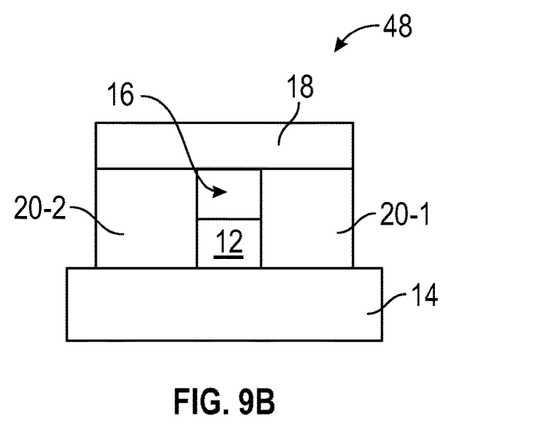
FIG. 9B is a side view that is oriented from the right side of the LED package of FIG. 9A.

FIG. 9A is a top view of an LED package 48 where spacers 20-1, 20-2 are arranged to extend continuously along two opposing side edges of the lens 18. FIG. 9B is a side view that is oriented from the right side of the LED package 48 of FIG. 9A. The spacers 20-1, 20-2 may be configured to respectively extend along two opposing edges (top edges in the view of FIG. 9A) in a continuous manner between corresponding corners of the lens 18. The spacers 20-1, 20-2 may additionally extend partially along the other edges (side edges in the view of FIG. 9A). In this manner the LED package 48 includes a similar configuration as the LED packages 10, 24, and 26 respectively of FIGS. 1, 2, and 3E.

Figure 10A:
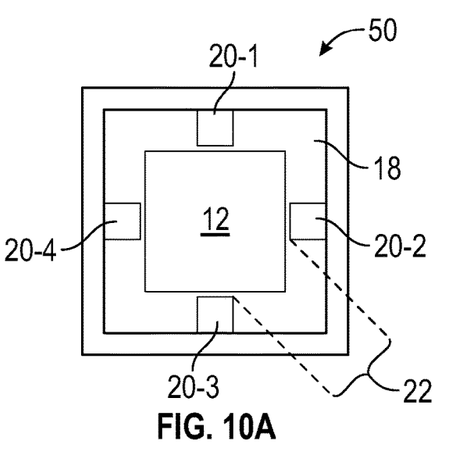
FIG. 10A is a top view of an LED package where spacers are arranged as pedestals or columns at peripheral edges of a lens.
Figure 10B:
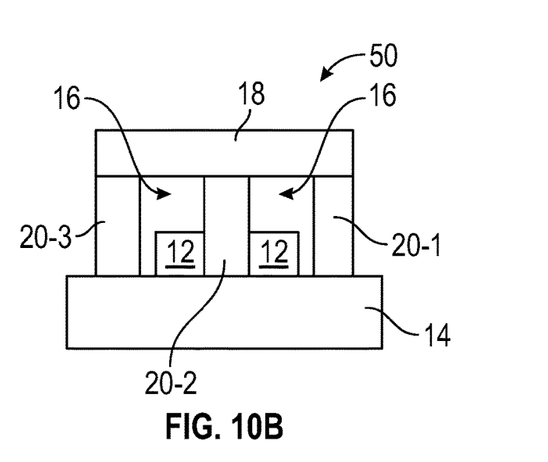
FIG. 10B is a side view that is oriented from the right side of the LED package of FIG. 10A.

FIG. 10A is a top view of an LED package 50 where spacers 20-1 to 20-4 are arranged as pedestals or columns at peripheral side edges of the lens 18. FIG. 10B is a side view that is oriented from the right side of the LED package 50 of FIG. 10A. As illustrated, the spacers 20-1 to 20-4 are centrally positioned at four peripheral edges of the lens 18, thereby supporting the lens 18 above the submount 14 and the one or more LED chips 12. In this manner, the apertures 22 are registered at the four corners of the lens 18 to provide an alternative air flow path that traverses the corners of the one or more LED chips 12.

Figure 11A:
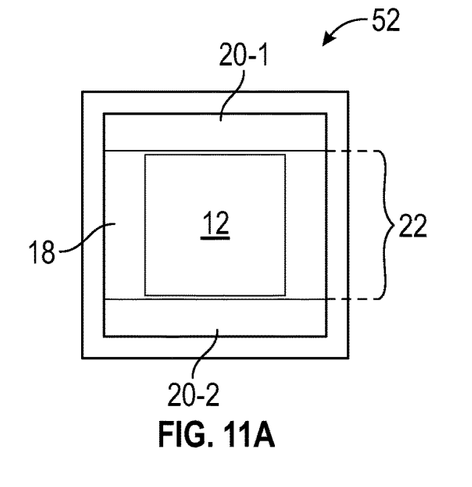
FIG. 11A is a top view of an LED package where spacers are arranged to extend continuously along two opposing edges of a lens.
Figure 11B:
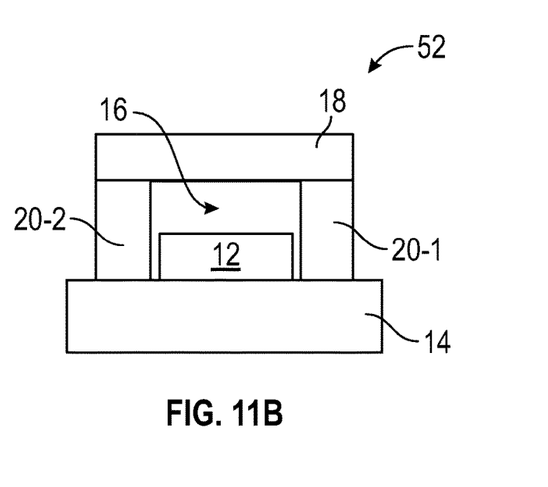
FIG. 11B is a side view that is oriented from the right side of the LED package of FIG. 11A.

FIG. 11A is a top view of an LED package 52 where spacers 20-1, 20-2 are arranged to extend continuously along two opposing side edges of the lens 18. FIG. 11B is a side view that is oriented from the right side of the LED package 50 of FIG. 11A. The spacers 20-1, 20-2 may be configured to respectively extend along two opposing edges (top edges in the view of FIG. 11A) in a continuous manner between corresponding corners of the lens 18. In this manner, the spacers 20-1, 20-1 are arranged to support the lens 18 above the submount 14 while providing larger sized apertures along other opposing edges (side edges in the view of FIG. 11A).

While various embodiments are described above that include arrangements for air flow between cavities of LED packages and ambient atmospheres for higher drive currents and increased heat dissipation, certain advantageous benefits may also be applicable to embodiments that do not allow air flow. As previously described, LED packages with LED chips and corresponding wire bonds that are embedded in conventional encapsulant materials may suffer from degradation and mechanical strain related to differences in coefficients of thermal expansion with the encapsulant materials. By providing LED chips within cavities as described herein, LED chips may not be directly encapsulated, thereby allowing higher drive currents per LED chip. Such benefits may also be applicable to embodiments that do not allow air flow with ambient environments. In this regard, any of the previously described embodiments may include spacers or lens portions that form cavities without apertures in order to hermetically seal the LED chips within the package. Such LED packages may not need to be sealed within larger lighting fixtures and modules.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
a submount;
at least one LED chip on the submount;
at least one spacer on the submount; and
a lens on the at least one spacer such that the at least one spacer is between the lens and the at least one LED chip and a cavity is at least partially formed between the lens and the submount, the cavity being registered with the at least one LED chip and configured to allow air flow between an interior volume of the cavity and an ambient environment outside the LED package during operation of the at least one LED chip.

2. The LED package of claim 1, wherein the at least one spacer comprises a plurality of spacers between the lens and the submount.

3. The LED package of claim 1, wherein the at least one spacer forms a height from the submount that is greater than a height of the at least one LED chip.

4. The LED package of claim 1, wherein the at least one spacer forms at least one aperture that is arranged to allow the air flow from outside the LED package.

5. The LED package of claim 1, wherein the at least one spacer forms a plurality of apertures arranged to allow the air flow from outside the LED package.

6. The LED package of claim 1, wherein the at least one spacer forms a first aperture at a first peripheral edge of the lens and a second aperture at a second peripheral edge of the lens.

7. The LED package of claim 1, wherein the at least one spacer is arranged along a perimeter of the lens.

8. The LED package of claim 7, wherein the lens is at least partially embedded within the at least one spacer along the perimeter of the lens.

9. The LED package of claim 7, wherein the at least one spacer comprises silicone.

10. The LED package of claim 7, wherein the lens is attached to the at least one spacer with an adhesive material.

11. The LED package of claim 7, wherein the lens forms a rectangular shape and the at least one spacer is arranged at one or more corners of the lens.

12. The LED package of claim 7, wherein the lens forms a rectangular shape and the at least one spacer is arranged along one or more side edges of the lens.

13. The LED package of claim 1, wherein the submount comprises a plurality of electrical traces that are electrically coupled to the at least one LED chip.

14. The LED package of claim 13, wherein the at least one LED chip is electrically coupled to a first electrical trace of the plurality of electrical traces by at least one wire bond, the at least one wire bond being arranged within the cavity.

15. The LED package of claim 13, wherein the at least one spacer is arranged to at least partially cover the plurality of electrical traces.

16. A light-emitting diode (LED) package comprising:
a submount comprising a first face and a second face that opposes the first face;
at least one LED chip on the first face; and
a lens attached to portions of the first face that laterally surround the at least one LED chip such that a cavity is at least partially formed between the lens and the submount, the cavity configured to allow air flow between an interior volume of the cavity and an ambient environment outside the LED package, the air flow being defined in at least two directions from the at least one LED chip during operation of the at least one LED chip, and the at least two directions being defined between the first face and the lens.

17. The LED package of claim 16, wherein the lens forms at least one aperture that is arranged to allow the air flow from outside the LED package.

18. The LED package of claim 16, wherein the lens forms a plurality of apertures arranged to allow the air flow from outside the LED package.

19. The LED package of claim 16, wherein the lens comprises lens portions that extend below a horizontal plane defined by a top surface of the at least one LED chip.

20. The LED package of claim 19, wherein the lens portions are adhered to the submount by an adhesive.

21. The LED package of claim 19, wherein the lens forms a rectangular shape and the lens portions are arranged at one or more corners of the lens.

22. The LED package of claim 19, wherein the lens forms a rectangular shape and the lens portions are arranged along one or more side edges of the lens.

23. The LED package of claim 16, wherein the submount comprises a plurality of electrical traces that are electrically coupled to the at least one LED chip.

24. The LED package of claim 23, wherein the at least one LED chip is electrically coupled to a first electrical trace of the plurality of electrical traces by at least one wire bond, the at least one wire bond being arranged within the cavity.

* * * * *